(12) United States Patent
Sasaki et al.

(10) Patent No.: US 6,180,528 B1
(45) Date of Patent: Jan. 30, 2001

(54) METHOD FOR FORMING A MINUTE RESIST PATTERN AND METHOD FOR FORMING A GATE ELECTRODE

(75) Inventors: Hidehiko Sasaki, Moriyama; Makoto Inai, Omihachiman, both of (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/356,547

(22) Filed: Jul. 19, 1999

(30) Foreign Application Priority Data

Aug. 7, 1998 (JP) .................................................. 10-225062

(51) Int. Cl.⁷ .................................................. H01L 21/302
(52) U.S. Cl. ............................................. 438/704; 438/717
(58) Field of Search .............................. 438/652, 653–57, 438/658, 704, 717, 725, 599, 669, 622; 430/5; 216/59, 84

(56) References Cited

U.S. PATENT DOCUMENTS 6,099,992 * 10/1995 Motoyama et al. ...................... 430/5

FOREIGN PATENT DOCUMENTS

| 62-090979 | 4/1987 | (JP) . |
| 5136018 | 6/1993 | (JP) . |
| 5166717 | 7/1993 | (JP) . |

* cited by examiner

Primary Examiner—Charles Bowers
Assistant Examiner—Craig Thompson
(74) Attorney, Agent, or Firm—Ostrolenk, Faber, Gerb & Soffen, LLP

(57) ABSTRACT

A method for forming a resist pattern includes the steps of: forming a dummy pattern on a semiconductor substrate using one type of a photosensitive resist; applying a resist mask on the semiconductor substrate so as to bury the dummy pattern using an opposite type of a photosensitive resist; forming a mixing layer at the interface between the dummy pattern and the resist mask by applying a heat treatment; and dissolving and removing the dummy pattern with an etchant in which the mixing layer and the resist mask are indissoluble so as to form an opening having a space width smaller than a width of the dummy pattern in the resist mask.

13 Claims, 7 Drawing Sheets

US 6,180,528 B1

METHOD FOR FORMING A MINUTE RESIST PATTERN AND METHOD FOR FORMING A GATE ELECTRODE

BACKGROUND OF THE INVENTION

1. Field of the Invention

The present invention relates to a method for forming a minute resist pattern, and more particularly to a method for forming a resist pattern with a fine space width and for forming a gate electrode using the pattern.

2. Description of the Related Art

There have been continuous demands for an increase in the integration of semiconductor devices and an increase in the operation frequency or speed of semiconductor devices. In order to meet the demands, it is necessary to make all the elements of a semiconductor device smaller in size. One of the elements required to be made smallest among various kinds of the semiconductor devices is a gate electrode in a compound semiconductor field effect transistor. Accordingly, there have been proposed various techniques to form a gate electrode having a small gate length.

(First Prior Art Method)

A common method for forming a conventional field effect transistor having a T-section gate electrode (or mushroom-shaped gate electrode) is shown in FIGS. 1A to 1D. In the first prior art, after forming a source electrode 2 and a drain electrode 3 on a compound semiconductor substrate 1 (FIG. 1A), a lower resist 4 is applied and formed on the source and drain electrodes 2, 3 on the semiconductor substrate 1, and an opening 5 to be the gate pattern is formed in the lower resist 4 by light exposure and development (FIG. 1B). After applying a heat treatment to the lower resist 4 at a high temperature, an upper resist 6 is applied onto the lower resist 4, and an inverted tapered opening 7 is formed in the upper resist 6, facing to the opening 5 of the lower resist 4 (FIG. 1C). Then, by depositing a gate metal on the semiconductor substrate 1 through the opening 7 of the upper resist 6 and the opening 5 of the lower resist 4, and removing the unnecessary gate electrode and resists 4 and 6, a T-section gate electrode 8 is formed by the lift-off method (FIG. 1D).

(Second Prior Art Method)

FIG. 2 shows a method for forming a minute pattern, utilizing the mixing effect of resists for realizing a minute opening size. A method related to this method is disclosed in Japanese Unexamined Patent Publication No. 5-166717. In the second prior art method, after applying a lower resist 4 onto a compound semiconductor substrate 1 with a source electrode 2 and a drain electrode 3 formed thereon (FIG. 2A), an opening 5 to be the gate pattern is formed in the lower resist 4 by exposing and developing a desired portion with an electron beam (FIG. 2B). Then, by applying a resin 9 for forming a mixing layer on the lower resist 4 so as to cover the opening 5 of the lower resist 4 (FIG. 2C), and removing unnecessary resin 9, a mixing layer 10 is formed on the lower resist 4 as well as an opening 11 is formed in the mixing layer 10 (FIG. 2D). At the time, since the mixing layer 10 covers the surface of the lower resist 4, the opening 11 of the mixing layer 10 is narrower than the opening 5 of the lower resist 4. An upper resist 6 is applied onto the mixing Layer 10, and an inverted tapered opening 7 is formed in the upper resist 6, facing to the opening 11 of the mixing layer 10 (FIG. 2E). Then, by depositing a gate metal on the semiconductor substrate 1 through the opening 7 of the upper resist 6 and the opening 11 of the mixing layer 10, and removing the unnecessary gate electrode, resists 4 and 6, and the like, a T-section gate electrode 8 is formed by the lift-off method (FIG. 2F). According to this method, since the gate length of the gate electrode 8 can be shorter by double as much as the film thickness of the mixing layer 10 compared with the case not having a mixing layer 10, a minute pattern can be formed.

(Third Prior Art Method)

As a method for forming a minute gate electrode, a dummy gate method shown in FIG. 3 is known conventionally. For example, Japanese Unexamined Patent Publication No. 62-90979 discloses such a method. In the third prior art method, a dummy gate 12 is formed with a resist on a compound semiconductor substrate 1 with a source electrode 2 and a drain electrode 3 formed thereon (FIG. 3A). Then, by forming an insulating film 13 for reversing the dummy gate 12, on the dummy gate 12 and on the semiconductor substrate 1 (FIG. 3B), and removing the dummy gate 12, a reverse opening pattern 14 is formed in the insulating film 13 (FIG. 3C). Afterwards, an upper resist 6 is applied on the insulating film 13, and an inverted tapered opening 7 is formed in the upper resist 6, facing to the opening 14 of the insulating film 13 (FIG. 3D). Then, by depositing a gate metal on the semiconductor substrate 1 through the opening 7 of the upper resist 6 and the inverted opening pattern 14 of the insulating film 13, and removing the unnecessary gate electrode and the upper resist 6, a T-section gate electrode 8 is formed by the lift-off method (FIG. 3E). Compared with the resolution limit of an ordinary light exposure method of 0.5 μm, the gate length of the gate electrode can further be made minute by processing the dummy gate 12 minutely in the dummy gate method.

Moreover, it is known that a minute pattern of about 0.3 μm can be obtained easily with a light pattern by using a phase shift mask for producing a dummy gate 12 as disclosed for example, in Japanese Unexamined Patent Publication No. 5-136018. The phase shift mask 15 is, as shown in FIG. 4, a transparent photo mask 16 provided with a shifter 17 thereon. When the phase shift mask 15 is irradiated with an ultraviolet ray, the intensity distribution of a light transmitted by the phase shift mask 15 is enlarged locally at the edges of the shifter 17. Therefore, by exposing a positive type resist with the phase shift mask 15, the minute dummy gate 12 can be produced on the semiconductor substrate 1, and finally, the gate electrode 8 with a minute gate length can be obtained.

However, by the method of providing the opening 5 for forming a gate electrode in the lower resist 4 by light exposure as in the above-mentioned first prior art method, a gate length of about 0.5 μm is the limit, and it is very difficult to realize a minute gate length shorter than about 0.5 μm.

Moreover, by the method of using the mixing layer 10 as in the above-mentioned second prior art method, since the mixing layer 10 is formed by the die pattern for forming the mixing layer (the opening 5 of the lower resist 4), a 0.4 μm gate length is the limit with respect to the 0.5 μm limit of the ordinary light exposure method. Furthermore, this method also has a problem in that the phase shift mask method, which is effective in achieving a minute gate pattern, cannot be used. Although a phase shift mask 15 can be used for forming an opening 5 in a lower resist 4, with a negative type resist used for the lower resist 4, the negative type resist has, in general, a poor resolution, and thus a minute pattern cannot be obtained. Besides, a high resolution negative type resist represented by the chemically amplified type has a poor reproductivity, and is difficult in control.

Further, although a minute gate length can be realized by the method of forming the gate electrode 8, using the dummy gate 12 as in the above-mentioned third prior art method, realization of a further minute gate length is desired. Furthermore, since the insulating film 13 exists in the vicinity of the T-section gate electrode in the method using the dummy gate 12, a problem is involved in that the gate parasitic capacity is increased so that the high frequency characteristics of the field effect transistor are deteriorated. Besides, since large size equipment is needed for forming the insulating film 13 to be used for reversing the dummy gate 12, the production cost is increased, and moreover, damage is easily introduced into the semiconductor substrate 1.

SUMMARY OF THE INVENTION

The present invention can solve the above-mentioned problems associated with the conventional art and provide a method for forming a resist pattern, capable of obtaining a further minute electrode pattern. The present invention also provide a method for forming a gate electrode having a fine gate length.

The method for forming a resist pattern comprises the steps of: forming a dummy pattern on a semiconductor substrate using one type of a photosensitive resist; applying a resist mask on the semiconductor substrate so as to bury the dummy pattern using an opposite type of a photosensitive resist; forming a mixing layer at the interface between the dummy pattern and the resist mask by applying a heat treatment; and dissolving and removing the dummy pattern with an etchant in which the mixing layer and the resist mask are indissoluble so as to form an opening having a space width smaller than a width of the dummy pattern in the resist mask.

The method for forming gate electrode on a semiconductor substrate comprises the steps of depositing a gate electrode material in the opening of the resist mask and over the resist mask and removing the resist mask to form a gate electrode on the semiconductor substrate, after forming the resist mask in accordance with the aforementioned method.

According to the present invention, it is possible to form a resist pattern having a fine space width, typically, less than about 0.3 $\mu$m without using electron beam exposure. Therefore, a field effect transistor having a minute gate electrode with excellent high frequency characteristics can be manufactured inexpensively with a good yield.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENT(S)

Figure 1A:
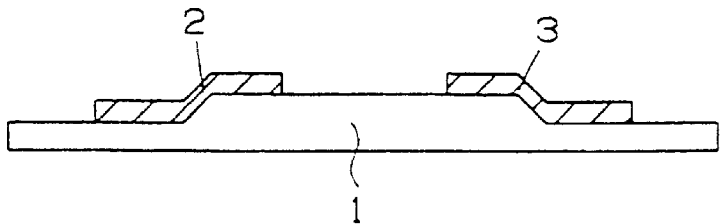
FIGS. 1A to 1D are diagrams for explaining a method for forming a gate electrode according to a first prior art method.
Figure 1B:
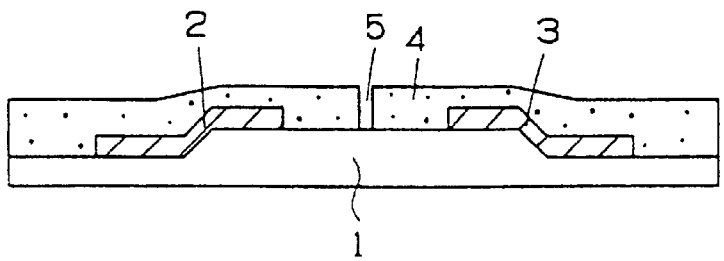
Figure 1C:
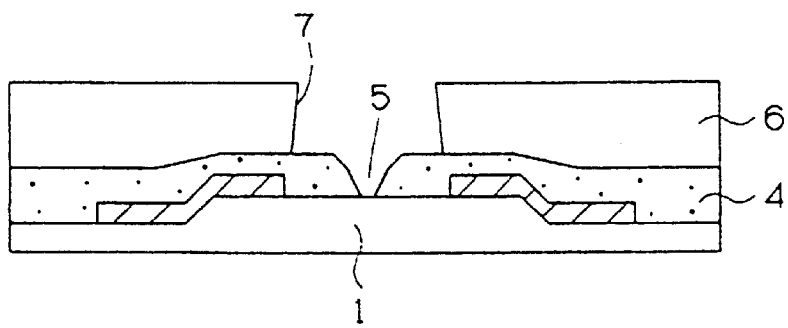
Figure 1D:
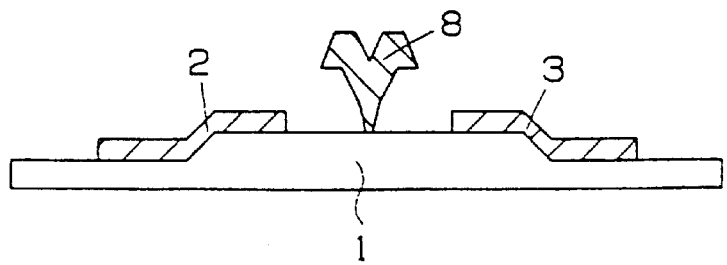
Figure 2A:
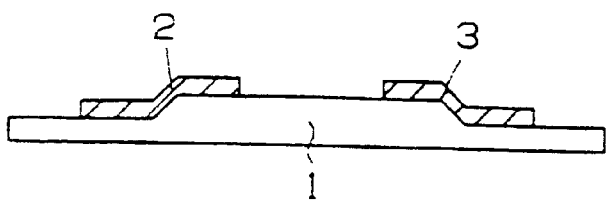
FIGS. 2A to 2F are diagrams for explaining a method for forming a gate electrode according to a second prior art method.
Figure 2B:
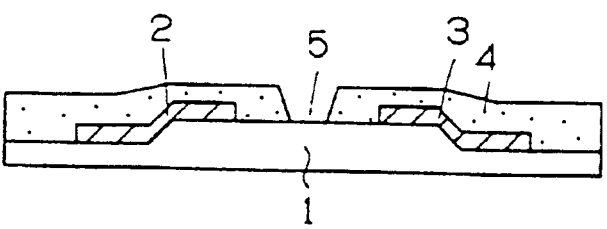
Figure 2C:
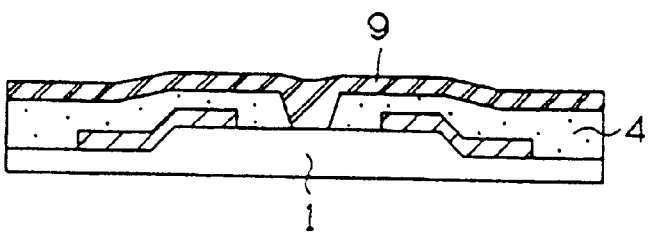
Figure 2D:
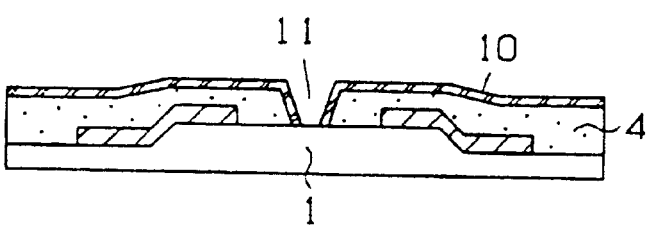
Figure 2E:
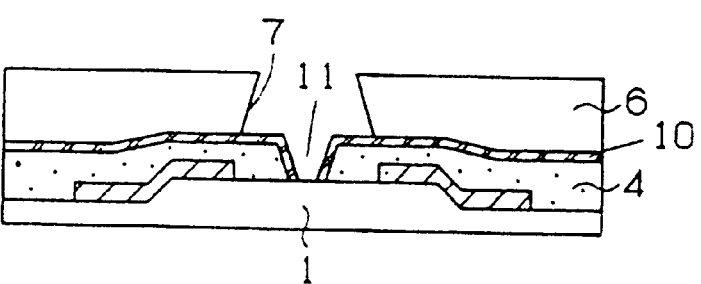
Figure 2F:
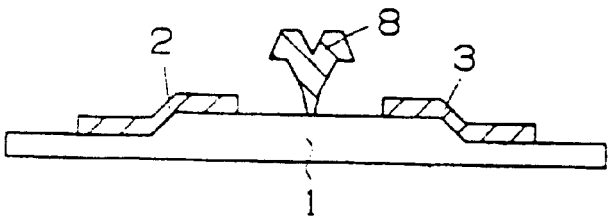
Figure 3A:
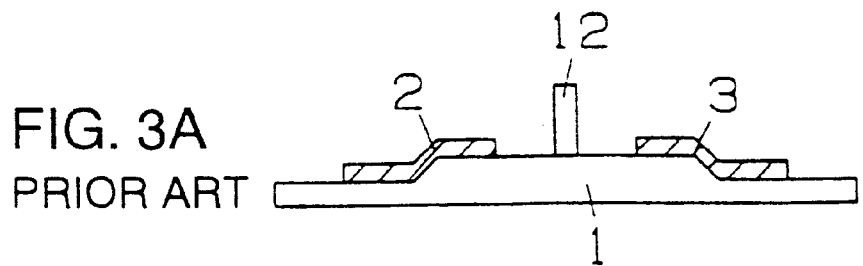
FIGS. 3A to 3E are diagrams for explaining a method for forming a gate electrode according to a third prior art method.
Figure 3B:
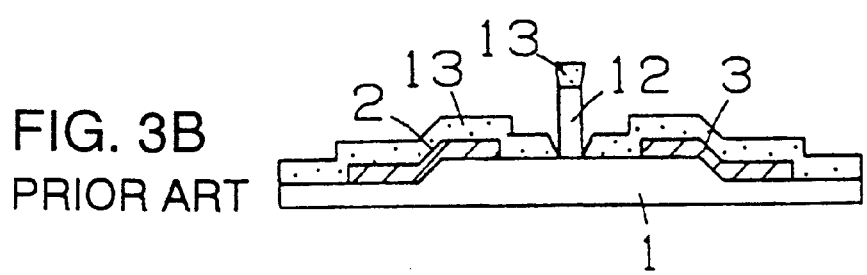
Figure 3C:
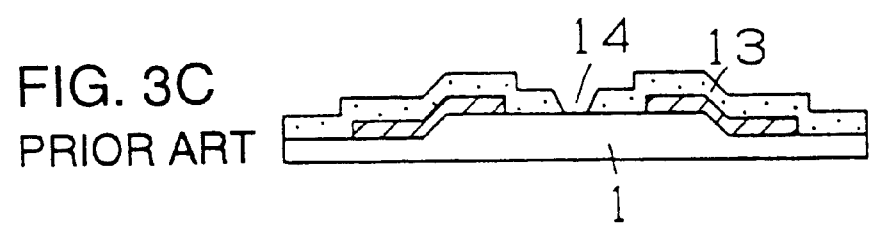
Figure 3D:
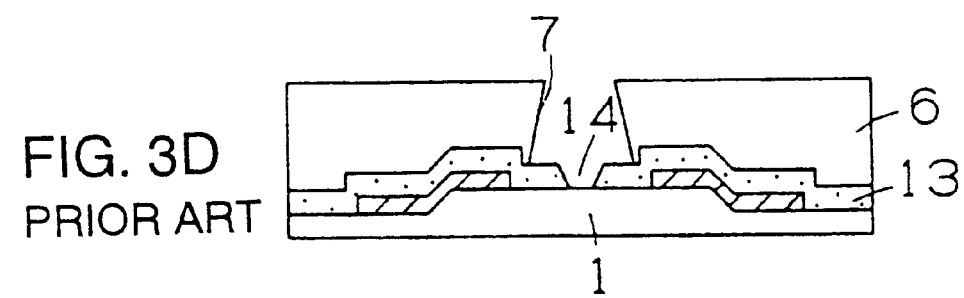
Figure 3E:
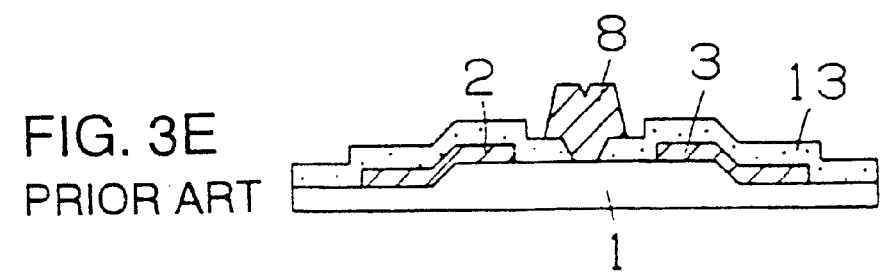
Figure 4:
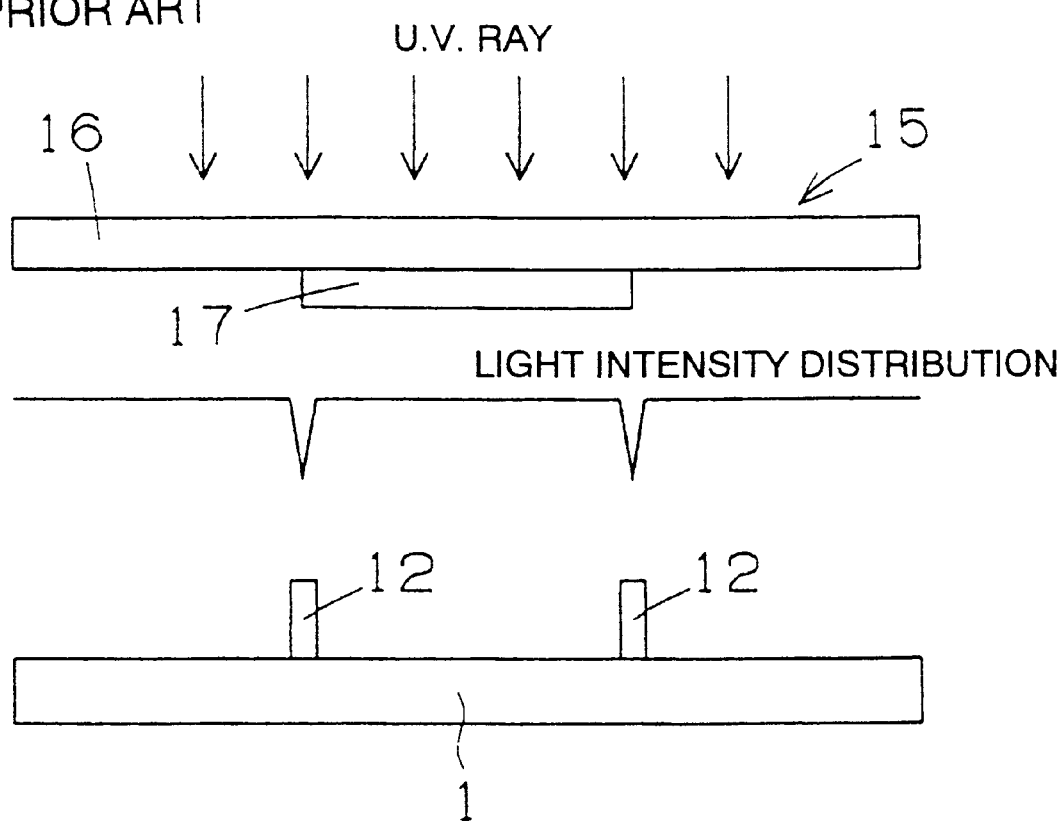
FIG. 4 is a diagram for explaining a prior art phase shift mask.

A method for forming a fine resist pattern according to the present invention comprises the steps of: forming a dummy pattern on a semiconductor substrate with one type of a photosensitive resist; applying a resist mask on the semiconductor substrate so as to bury the dummy pattern with the other type of a photosensitive resist; forming a mixing layer at the interface between the dummy pattern and the resist mask by applying a heat treatment; and dissolving and removing the dummy pattern with am etchant, by which the mixing layer and the resist mask are indissoluble.

It is noted that the type of Photosensitive resist here refers to positive and negative ones.

It is well known that a minute pattern can be obtained by using a dummy pattern such as a dummy gate. In particular, by using a phase shift mask, an extremely minute pattern can be obtained. Since a mixing layer is formed on the surface of a dummy pattern, utilizing a generation of a mixing layer indissoluble by a developer at the interface between the different photosensitive resists in the present invention, the width of the opening formed after dissolving and removing the dummy pattern is narrower than the width of the original dummy pattern owing to the remaining mixing layer. Therefore, according to the present invention, a further minute opening pattern can be obtained compared with a pattern obtained by the dummy gate method, or the like. Or by forming a metal pattern, or the like, such as a gate electrode in the opening pattern, a further minute pattern compared with a metal pattern of the conventional dummy gate method can be obtained.

Specifically, it is preferable that a dummy pattern is formed with a positive type resist, and a resist mask is formed with a negative type resist. Since a minute dummy pattern can be obtained with light exposure by the use of a positive type resist, a pattern to be obtained finally can further be minute. In this case, by using an alkaline developer after exposing the dummy pattern by dry etching the resist mask, the dummy pattern can be dissolved and removed selectively.

Moreover, according to the present invention, since electron exposure is not needed, a minute gate electrode can be produced easily. And further, since the insulating film does not need to be formed, production equipment can be simplified, and the production cost can be lowered. Furthermore, since the vicinity of the gate electrode can be a space by removing the resist mask and the mixing layer after forming the gate electrode in the opening of the mixing layer, increase of the gate parasitic capacity can be restrained and deterioration of the high frequency characteristics of the field effect transistor can be prevented.

Hereinafter, a preferred embodiment of the present invention is explained in more detail with reference to the drawings.

FIGS. 5A to 5F are diagrams for explaining a method for forming a gate electrode according to one embodiment of the present invention. It shows the case of forming a T-section gate electrode in a field effect transistor, such as GaAs MESFET, HFET (hetero junction field effect transistor), or the like.

Figure 5A:
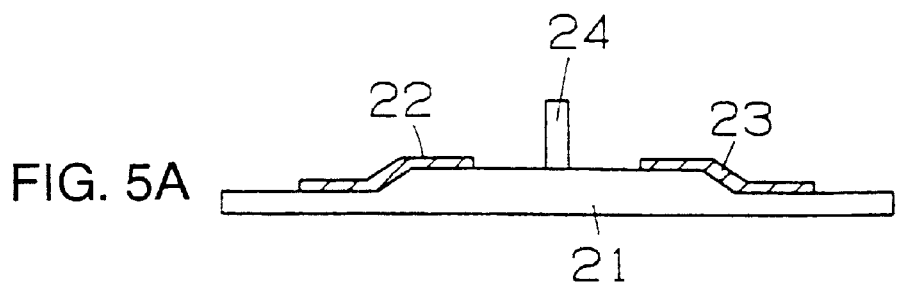
FIGS. 5A to 5F are diagrams for explaining a method for forming a gate electrode according to one embodiment of the present invention.

First, a source electrode 22 and a drain electrode 23 are provided on a compound semiconductor substrate 21 such as a GaAs substrate, or the like, with an epitaxial growth layer(s) formed thereon. A dummy gate 24 with, for example, a 0.3 µm width (gate length of the dummy gate) is formed by forming a positive type resist (such as Pfi26A: produced by Sumitomo Chemical Industry Corp., Japan) with a 1 µm film thickness on the semiconductor substrate 21 provided with the source and drain electrodes 22, 23, and light exposure with a phase shift mask and development (FIG. 5A).

Figure 5B:
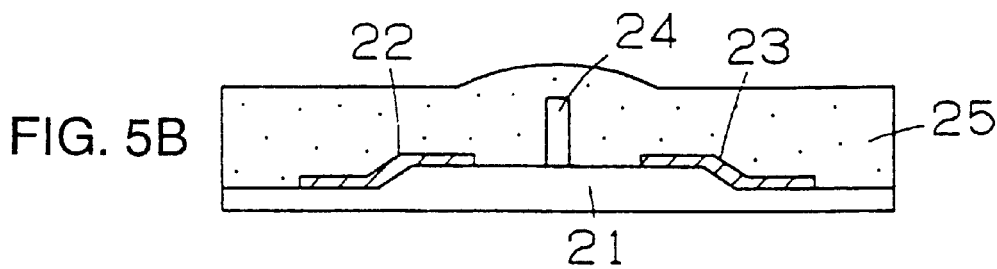
Figure 6:
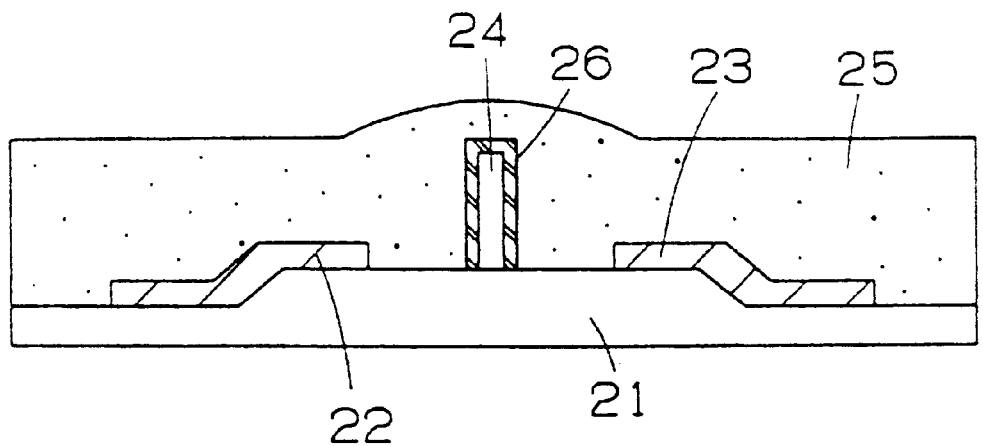
FIG. 6 is an enlarged diagram showing a part of the above-mentioned gate electrode forming step.

Then, a negative type resist 25 (for example, OMR-85: produced by Tokyo Oka Kogyo Corp., Japan) is applied and formed with a 1 µm film thickness so as to cover the dummy gate 24 (FIG. 5B). Thereafter, a heat treatment is conducted with a 20° C. to 120° C. temperature range, 60 minutes or less treatment condition. According to the heat treatment, a mixing layer 26 indissoluble by an alkaline developer is formed as shown in FIG. 6 at the interface between the dummy gate 24 comprising the positive type resist and the negative type resist 25 by diffusion or reaction of the positive type resist and the negative type resist. Here, according to the above-mentioned heat treatment condition, the mixing layer 26 can be formed with a stable film thickness.

Figure 5C:
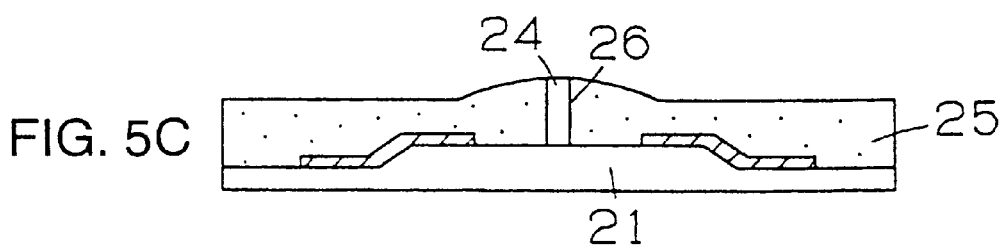
Figure 5D:
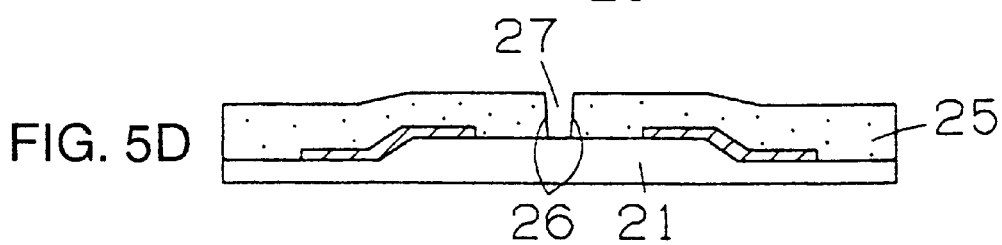

Then, by etching and removing the negative type resist 25 with a dry etching device such as RIE, or the like, the upper surface of the dummy gate 24 is exposed (FIG. 5C). After exposing the upper surface of the dummy gate 24, only the dummy gate 24 is removed selectively with an alkaline developer so as to obtain a reversed opening 27 after removing the dummy gate 24 (FIG. 5D).

More specifically, in order to expose the dummy gate 24, the negative type resist 25 is removed by the dry etching method using, for example, an $O_2$ gas. After exposing the dummy gate 24, the entirety of the semiconductor substrate 21 is light exposed for sufficiently exposing the positive type resist, which is the dummy gate 24, and then the dummy gate 24 is removed with an ordinary alkaline developer (for example, NMD-3: produced by Tokyo Oka Kogyo Corp., Japan). According to the method, an insulating film needs not be formed for reversing the dummy gate 24, and thus the semiconductor substrate 21 is not damaged. Moreover, since the mixing layer 26 is indissoluble and not exposed or removed in the alkaline development, the targeted opening size can be obtained with certainty.

Figure 7:
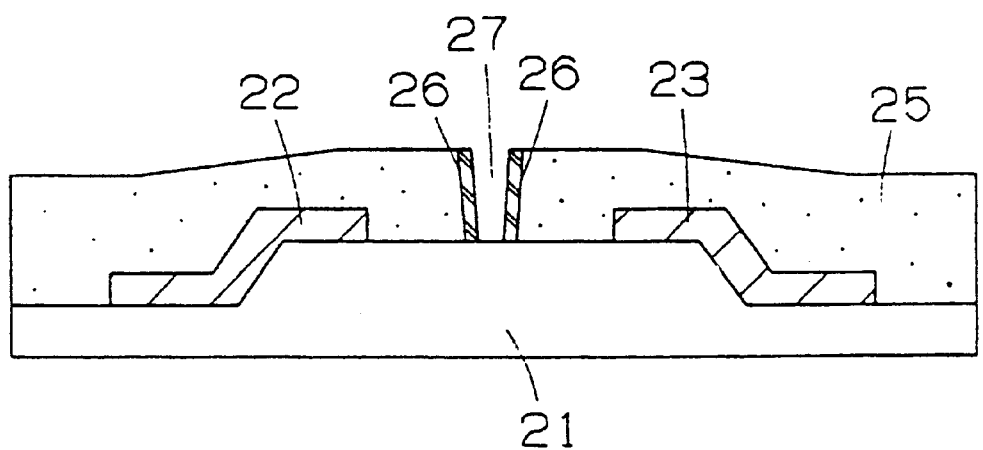
FIG. 7 is an enlarged diagram showing a part of the above-mentioned gate electrode forming step.

Since the mixing layer 26 remains without being removed in the reversed opening 27 accordingly obtained as shown in FIG. 7, the opening width of the reversed opening 27 is further narrower than the width of the minute dummy gate 24 formed with the phase shift mask, and thus a further minute opening pattern compared with the opening width obtained by merely reversing the dummy gate 24 can be obtained.

Figure 5E:
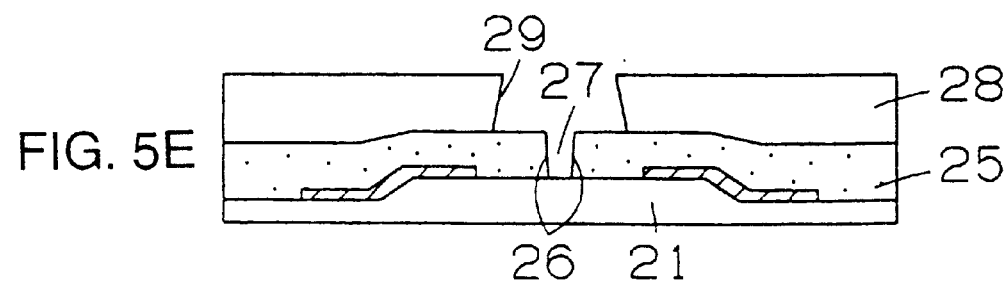

Then, after conducting a baking treatment, for example, in a 180° C. atmosphere for 15 minutes, an upper resist 28 is applied with an image reversing resist (for example, AZ5214E: Produced by Hoechst Japan Corp., Japan), and an inverted tapered opening pattern 29 larger than the opening 27 is formed in the upper resist 28 (FIG. 5E).

Figure 5F:
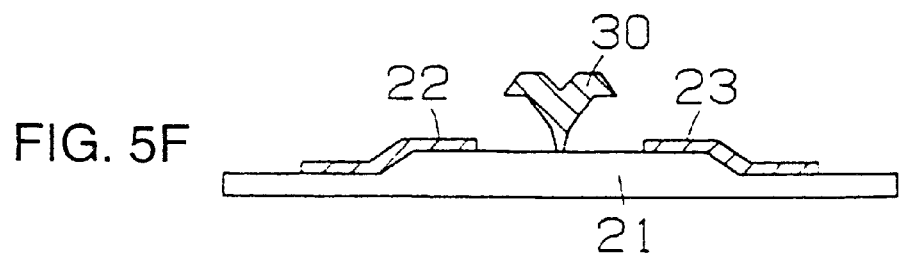

Finally, by depositing a gate metal (for example, a laminated product comprising Ti, Pt, and Au from the lower layer) in the opening 29 of the upper resist 28 and the opening 27 of the mixing layer 26 with the vacuum deposition method, and removing the unnecessary gate metal and resists, a T-section gate electrode 30 is formed by the lift-off method (FIG. 5F).

By forming the gate electrode 30 as mentioned above, since the dummy gate 24 with a minute line width can be obtained by the phase shift mask method, suited or forming a minute pattern with light exposure, and further, the mixing layer 26 indissoluble with a developer is formed at the interface between the dummy gate 24 and the negative type resist 25, which is the reversing material thereof, a gate opening pattern having a size narrower than the resolution limit or the initial dummy gate length can be obtained by removing the dummy gate 24 by development, and thus a gate electrode with a further minute gate length can be obtained compared with the conventional dummy gate method.

Figure 8:
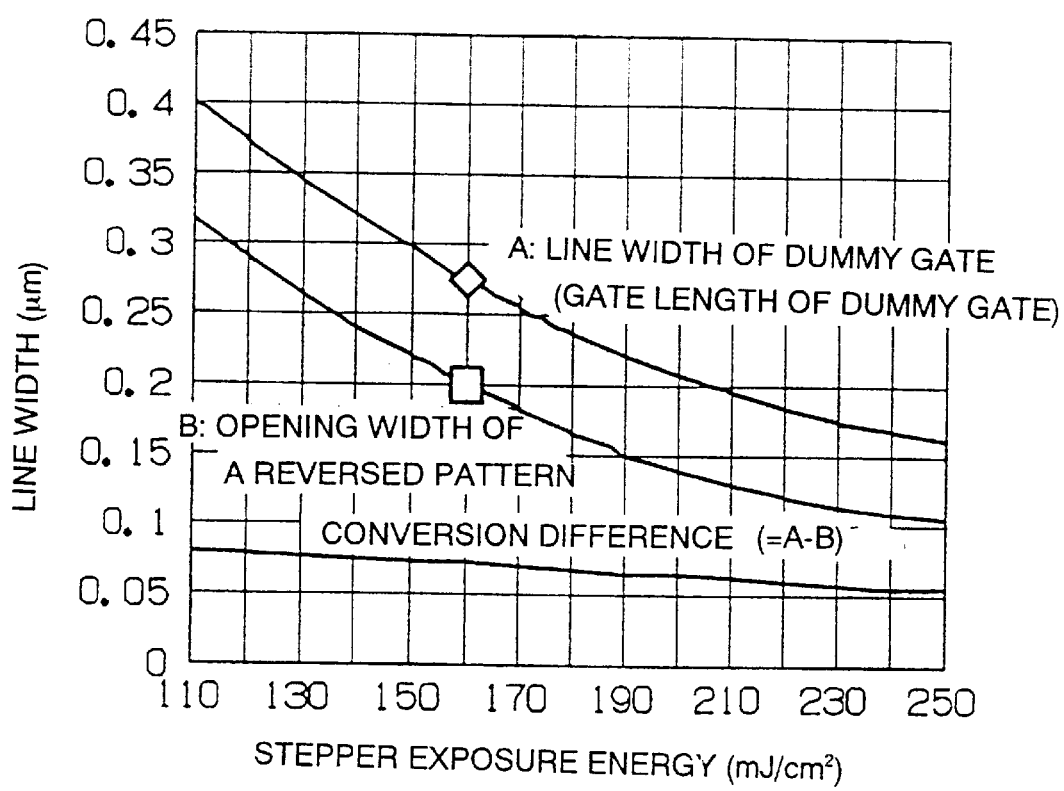
FIG. 8 is a graph showing the dummy gate length of the dummy gate and the opening width of the mixing layer in comparison.

FIG. 8 shows the line width of a dummy gate formed with a phase shift mask (dummy gate length) and a reversed pattern width obtained by the method of the present invention (opening width of the mixing layer). According to the figure, for example, when the exposure energy of a stepper is 150 mJ/cm$^2$, a 0.3 µm dummy gate can be obtained, whereas, the reversed pattern width, that is, the gate width is about 0.2 µm. Therefore, as shown in FIG. 8, the gate width can be shortened by about 0.05 to 0.1 µm.

Moreover, according to the method of the present invention, since the resist used for forming the gate electrode is completely removed finally, a gap is formed in the vicinity of the T gate electrode, and thus the parasitic capacity can be smaller. Furthermore, unlike the conventional dummy gate method explained as the third prior art method, a minute pattern can be formed without the need of strict process administration in the minute processing of the dummy gate. Moreover, since an insulating film is not used, production cost increase by the insulating film formation, increase of the parasitic capacity, and introduction of damage can be avoided. Further, since the negative type resist used in this embodiment has both functions as the reversing material and the mixing formation material, the advantages of the second and third prior arts can be obtained inexpensively.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for forming a resist pattern comprising the steps of:

forming a dummy pattern on a semiconductor substrate using one type of a photosensitive resist;

applying a resist mask on the semiconductor substrate so as to bury the dummy pattern using an opposite type of a photosensitive resist;

forming a mixing layer at the interface between the dummy pattern and the resist mask by applying a heat treatment; and dissolving and removing the dummy pattern with an etchant in which the mixing layer and the resist mask are indissoluble so as to form an opening having a space width smaller than a width of the dummy pattern in the resist mask.

2. The method for forming a resist pattern according to claim 1, wherein the dummy pattern is formed using a positive type resist, and the resist mask is formed using a negative type resist.

3. The method for forming a resist pattern according to claim 2, further comprising the step of exposing the dummy pattern buried in the resist mask by dry etching the resist mask.

4. The method for forming a resist pattern according to claim 3, wherein the etchant is an alkaline developer.

5. The method for forming a resist pattern according to claim 2, wherein the dummy pattern is formed by exposing the one type of photosensitive resist to light through a phase shift mask.

6. The method for forming a resist pattern according to claim 5, wherein the space width of the opening in the resist mask is less than about 0.1 to 0.3 µm.

7. A method for forming a gate electrode on a semiconductor substrate, comprising the steps of:

forming a dummy pattern on a semiconductor substrate using one type of a photosensitive resist;

applying a resist mask on the semiconductor substrate so as to bury the dummy pattern using an opposite type of a photosensitive resist;

forming a mixing layer at the interface between the dummy pattern and the resist mask by applying a heat treatment;

dissolving and removing the dummy pattern with an etchant in which the mixing layer and the resist mask are indissoluble so as to form an opening having a space width smaller than a width of the dummy pattern in the resist mask;

depositing a gate electrode material in the opening of the resist mask and over the resist mask; and removing the resist mask to form a gate electrode on the semiconductor substrate.

8. The method for forming gate electrode on a semiconductor substrate according to claim 7, further comprising the step of forming an upper resist on the resist mask before depositing the gate electrode material, the upper resist having an opening larger than the opening of the resist mask at a position corresponding to the opening of the resist mask.

9. The method for forming gate electrode on a semiconductor substrate according to claim 8, wherein the dummy pattern is formed using a positive type resist, and the resist mask is formed using a negative type resist.

10. The method for forming gate electrode on a semiconductor substrate according to claim 9, further comprising the step of exposing the dummy pattern buried in the resist mask by dry etching the resist mask.

11. The method for forming gate electrode on a semiconductor substrate according to claim 10, wherein the etchant is an alkaline developer.

12. The method for forming gate electrode on a semiconductor substrate according to claim 9, wherein the dummy pattern is formed by exposing the one type of photosensitive resist to light through a phase shift mask.

13. The method for forming gate electrode on a semiconductor substrate according to claim 12, wherein the space width of the opening in the resist mask is less than about 0.1 to 0.3 µm.

* * * * *